(12) United States Patent
Shen (10) Patent No.: US 8,120,153 B1
(45) Date of Patent: Feb. 21, 2012

(54) HIGH-TEMPERATURE, WIREBONDLESS, INJECTION-MOLDED, ULTRA-COMPACT HYBRID POWER MODULE

(75) Inventor: Zheng John Shen, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 641 days.

(21) Appl. No.: 11/521,176

(22) Filed: Sep. 14, 2006

Related U.S. Application Data (60) Provisional application No. 60/718,132, filed on Sep. 16, 2005.

(51) Int. Cl.
  *H01L 23/495* (2006.01)
  *H01L 23/29* (2006.01)
(52) U.S. Cl. ........ 257/677; 257/789; 257/792; 257/795; 257/E23.042
(58) Field of Classification Search .................. 257/678, 257/677, 666, 675, 788, 792, 794, E23.031, 257/E23.042, 789; 438/106
  See application file for complete search history.

(56) References Cited

U.S. PATENT DOCUMENTS

| | | | |
|---|---|---|---|
| 4,796,078 A | 1/1989 | Phelps, Jr. et al. | 357/68 |
| 5,024,883 A * | 6/1991 | SinghDeo et al. | 428/323 |
| 5,750,423 A * | 5/1998 | Ishii | 438/112 |
| 5,869,890 A | 2/1999 | Nishiura et al. | 257/705 |
| 5,966,291 A | 10/1999 | Baumel et al. | 361/707 |
| 6,046,507 A * | 4/2000 | Hatchard et al. | 257/790 |
| 6,135,645 A * | 10/2000 | Grotsch | 385/92 |
| 6,215,176 B1 | 4/2001 | Huang | 257/666 |
| 6,307,755 B1 * | 10/2001 | Williams et al. | 361/813 |
| 6,316,822 B1 * | 11/2001 | Venkateshwaran et al. | 257/666 |
| 6,574,107 B2 | 6/2003 | Jeon et al. | 361/709 |
| 6,780,680 B2 * | 8/2004 | Schoenfeld | 438/123 |
| 7,409,572 B1 * | 8/2008 | Hung et al. | 713/500 |
| 2002/0012762 A1 * | 1/2002 | Bunyan | 428/40.2 |
| 2003/0042437 A1 | 3/2003 | Worley et al. | 250/551 |
| 2003/0127713 A1 | 7/2003 | Schoenfeld | 257/666 |
| 2003/0183895 A1 | 10/2003 | Okamura et al. | 257/454 |
| 2003/0201520 A1 | 10/2003 | Knapp et al. | 257/666 |
| 2004/0056346 A1 | 3/2004 | Palm et al. | 257/706 |

(Continued)

OTHER PUBLICATIONS

R.C. Clarke, et al., "*SiC Microwave Power Technologies,*" *Proceedings of the IEEE*, vol. 90, No. 6, Jun. 2002, pp. 987-992.

(Continued)

*Primary Examiner* — Shouxiang Hu
(74) *Attorney, Agent, or Firm* — Brian S. Steinberger; Phyllis K. Wood; Law Offices of Brian S. Steinberger, P.A.

(57) ABSTRACT

A cost-effective, ultra-compact, hybrid power module packaging system and method for making allows device operation in conventional and high temperature ranges over 300° C. Double metal leadframes are directly bonded to the front- and backside of semiconductor chips, and injection-molded high temperature polymer materials encapsulate the module. The invention eliminates the use of unreliable metal wirebonds and solders joints, and expensive aluminum nitride ceramic substrates commonly used in conventional and high temperature hybrid power modules. Advantages of the new power modules include high current carrying capability, low package parasitic impedance, low thermo-mechanical stress under high temperature cycling, low package thermal resistance (double-side cooling), modularity for easy system-level integration, and low-cost manufacturing of devices compatible with current electronic packaging industry. A first embodiment uses molybdenum leadframes for operation in temperatures over 300° C.; a second embodiment of the invention, uses copper and copper alloy leadframes, provides benefits for conventional temperature electronics.

10 Claims, 8 Drawing Sheets

U.S. PATENT DOCUMENTS

| | | | | |
|---|---|---|---|---|
| 2004/0228094 | A1 | 11/2004 | Ahmed et al. | 361/702 |
| 2004/0232545 | A1* | 11/2004 | Takaishi | 257/707 |
| 2005/0012080 | A1* | 1/2005 | Zimmerman | 252/500 |
| 2005/0087847 | A1 | 4/2005 | Kuan et al. | 257/666 |
| 2005/0133902 | A1 | 6/2005 | Pavier et al. | 257/691 |
| 2005/0156291 | A1 | 7/2005 | Shiu et al. | 257/666 |
| 2007/0049665 | A1* | 3/2007 | Musa et al. | 524/105 |

OTHER PUBLICATIONS

J.A. Cooper, et al., "*SiC Power-Switching Devices—The Second Electronics Revolution?,*" Proceedings of the IEEE, vol. 90, No. 6, Jun. 2002, pp. 956-968.

J.A. Cooper, et al., "*Status and Prospects for SiC Power MOSFETs,*" IEEE Trans Electon Devices, vol. 49, No. 4, Apr. 2002, pp. 658-664.

David Palmer, "*Hybrid Microcircuitry for 300°C Operation,*" IEEE Trans on Parts, Hybrids, and Packaging, vol. PHP-13, No. 3, Sep. 1977, pp. 252-763.

Z. Lin, et al., "*An AlN-based High Temperature Package for SiC Devices: Materials and Processing,*" Proc. Of Intnl. Symp. On Adv. Packaging Materials, 2005.

F.P. McClusky, et al., "*High Temperature Electronics,*" CRC Press, 1997, p. 130, p. 147, p. 151.

J.E. Sergent, et al., "*Hybrid Microelectronics Handbook,*" McGraw-Hill, 1995, pp. 7-21-7-23.

* cited by examiner

HIGH-TEMPERATURE, WIREBONDLESS, INJECTION-MOLDED, ULTRA-COMPACT HYBRID POWER MODULE

This application claims the benefit of priority from U.S. Provisional Patent Application 60/718,132, filed on Sep. 16, 2005.

FIELD OF THE INVENTION

This invention relates to electronic packaging technology and, in particular to, high-power and high-temperature hybrid power module packaging.

BACKGROUND AND PRIOR ART

Silicon carbide (SiC) is widely considered as the power semiconductor of choice due to its wide energy band-gap, high breakdown field strength, high operating junction temperature, high carrier saturation drift velocity, and high thermal conductivity. SiC devices offer great potential for use in high-temperature, high-power, high-frequency, and radiation-resistant military applications such as ultra-compact, ultra-light power conversion units for in-ground power sources, hybrid military vehicles, electric aircraft and ships, and nuclear power instrumentation.

SiC devices can also be used in a wide range of commercial applications including hybrid electric cars, power supplies, and electric utility power units. SiC has several advantages over other competing wide band-gap semiconductors, such as, gallium nitride (GaN) and diamond, including commercial availability of substrate materials and known device processing techniques.

Twelve hundred volt/twenty amperes (1200V/20 A) SiC Schottky diodes are now commercially available from Cree, Inc., Durham, N.C. 27703. A 2000V SiC power Metal-Oxide-Semiconductor Field Effect Transistor (MOSFET) with a low specific on-resistance of 10.3 m$\Omega$-cm$^2$ was also reported recently. The latest breakthrough in defect-free SiC crystal growth technology from Denso Corporation, headquartered in Kariya, Aichi prefecture, Japan, is expected to expedite the large scale commercialization of SiC in the near future.

SiC devices can safely operate at a junction temperature up to 500-600° C. Such a high operating temperature range can substantially reduce or totally eliminate the need of bulky and costly thermal management components such as liquid cooling components, fans, and heat sinks commonly used in silicon-based power electronic systems, leading to smaller, lighter, more efficient, and more reliable power converter design particularly suitable for military applications.

The thermal management subsystems in many silicon-based power converters account for up to 30-40% of the total system cost. The cost benefit at the system level resulted from higher operating temperatures can partially offset the high cost of today's SiC components, eventually leading to a net cost reduction as the SiC technology evolves. However, a major limitation to fully realizing the potential of SiC and other wide band-gap semiconductor materials is the lack of qualified high-temperature packaging systems, particularly those with high-current and high-voltage capabilities required for power conversion applications. The commercial SiC Schottky diodes currently available are only rated for an operating junction temperature up to 175° C. due to the limitation of the conventional plastic packages used.

The overall goal of packaging is to distribute signal and power, dissipate heat, protect the devices enclosed, and ensure reliable operation of semiconductor devices. Considerable progress has been made in the field of high-temperature electronics and electronic packaging in the past two decades as discussed below in the description of metal, ceramic and plastic packages. The high-reliability packaging schemes used today for military applications do offer considerable high temperature operation capability, but fall short on power handling capability and other requirements.

Metal packages for semiconductors are commercially available and can be a single metal package in a circular shape, a single metal package in a rectangular shape or, a single metal package with glass-sealed output leads. A single metal package is usually made of gold-plated Kovar (an alloy of 53% iron, 29% nickel). The output leads are sealed into the Kovar package sidewalls or floor using glass-to-metal seals or ceramic feedthroughs. The metal packages are designed with welded metal lids. Gold (Au) wires are typically used to interconnect the semiconductor chip and the metal leads using a wirebonding technique.

Some metal packages have been evaluated to 400° C. with satisfactory results, as reported in the National Research Council, *Materials for High Temperature Semiconductor Devices, National Academy Press,* 1995. However, these packages are limited to relatively low current applications due to the use of thin Au wires (typically 2-5 mils in diameter). Paralleling these packages for higher current capability may be feasible for low-frequency power converters, but does not provide a viable solution for high-density high-performance power electronic systems due to the inevitable large parasitic impedance and physical dimensions associated.

Ceramic packages are another widely used type of package that provides good high-temperature performance. Ceramic packages are manufactured using a co-fired tape process and have an advantage over metal packages because they can avoid the use of expensive fragile glass-to-metal seals. The packages can be sealed either by soldering or welding. Temperature limitations for ceramic packages depend on the type of sealing method used. However, ceramic packages are not suitable for high-current applications due to the high resistance of the refractory metal interconnects used inside the packages.

A third type of prior art packaging is the plastic package. Plastic packages are the most common type of electronic packages for conventional temperature electronics. A semiconductor chip is attached to a metal leadframe (usually formed on a stamped copper sheet). Wire bonding is then performed to interconnect the chip's top surface to the metal leadframe. Subsequently, thermosetting plastics such as alkyds, allyls, epoxies, phenolic, unsaturated polyesters, polyimides, polyurethanes, and silicones, can be injected, compressed, or transferred into the mold with the metal leadframe as the insert.

Alternatively, thermoplastic plastics such as acrylic, fluoropolymers, liquid crystal polymers, and nylons can be also used as the encapsulation molding compound. Plastic electronic packages offer low cost, high manufacturability, and compact package sizes. However, today's plastic packages are not suitable for operating temperature above 150° C. For example, the glass transition temperature of commonly used packaging epoxies is in the range of 130-170° C., which limits the operating temperature range of the package.

Plastic packages also subject wire bonds to extreme stresses if the package undergoes large temperature swings. Nevertheless, the continued use of plastic package in the high temperature ranges is highly desirable. Recent advances in high temperature polymer materials have shown great promise. For example, Quantum Leap Packaging, Inc. (Wilmington, Mass.) has developed a new Liquid Crystal Polymer (LCP) as an encapsulation material to compete with the more costly and traditional ceramic and metal component packaging. A key feature of Quantum Leap's LCP material is that it supports up to 400° C. applications while still offering MIL-SPEC hermetic properties. Other high temperature injection molding plastics have also been reported in *High Temperature Electronics*, edited by R. Kirschman, IEEE Press, 1999.

A fourth type of conventional hybrid power module exists. For conventional temperature high power electronic systems, multi-chip hybrid power modules are predominantly used. The hybrid modules distribute signal and power, dissipate heat, protect the devices enclosed, and serve as the basic power electronics building block (PEBB).

Figure 1A:
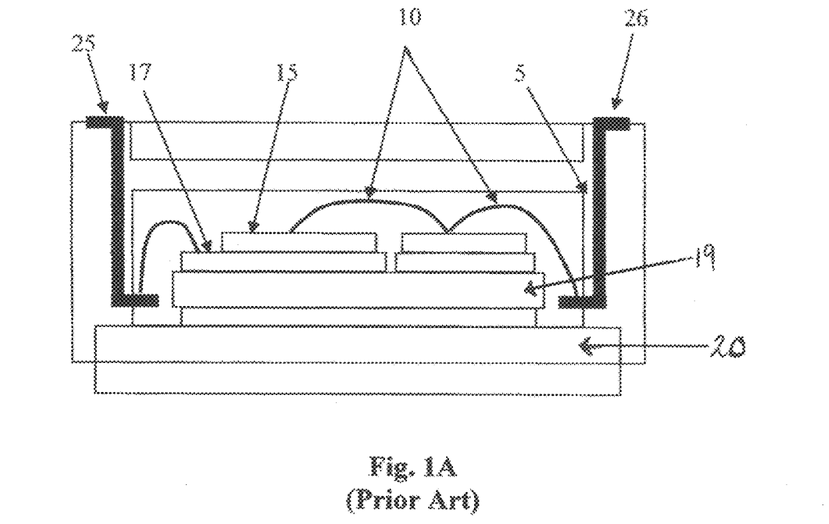
FIG. 1A shows the basic structure of hybrid power module using wirebond, DBC substrate and Cu base plate. (Prior Art)
Figure 1B:
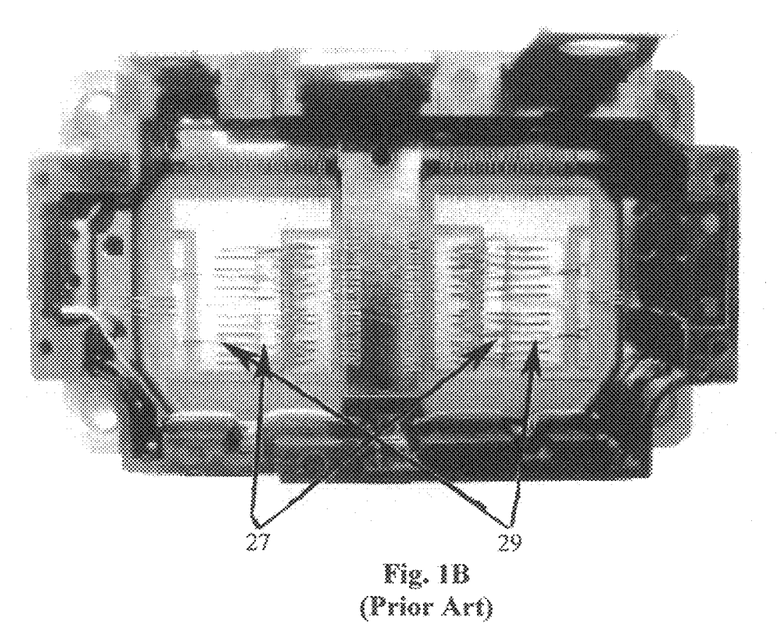
FIG. 1B is a half-bridge Si-IGBT/SiC-Diode power module (Prior Art)

The state-of-the-art power module technology, initially developed in mid-1980's, mainly relies on the use of aluminum wirebonds, direct-bond-copper (DBC) ceramic substrates, and copper base plates, as shown in FIGS. 1A and 1B.

FIG. 1A shows the basic structure of a hybrid power module in a case 5 using aluminum wirebond 10 with a semiconductor chip 15 on a copper layer 17 supported by a ceramic DBC substrate 19 and Cu base plate 20 wherein the aluminum wirebond 10 is connected to copper terminals 25, 26. FIG. 2B is a photograph of a half-bridge Si-IGBT/SiC-Diode power module from Cree/Powerex. The SiC Schottky diodes 27 and Si-IGBTs 29 rely on the use of aluminum wire bonds, direct-bond-copper ceramic substrates and copper substrates in the arrangement shown.

The thin aluminum wirebonds suffer from high parasitic impedance, fatigue-induced lift-off failures, and inability of removing heat. The DBC ceramic substrate, aluminum oxide ($Al_2O_3$) or more expensive aluminum nitride (AlN), provides electrical isolation but inadvertently increases the package thermal resistance. The thick copper (Cu) base plate serves as heat spreader but considerably increases the weight, size, and thermal resistance of the power module. The easy oxidation of Cu, low melting temperatures of the tin/lead (Sn/Pb) solder joints of chip-to-DBC and DBC-to-baseplate, and low glass transition temperature of the epoxy case all prevent the use of the conventional power modules in high temperature applications.

Most recently, within the last five years, federal agencies including the Department of Defense (DOD) and the National Aeronautical Space Administration (NASA) have funded several Small Business Innovation Research (SBIR) projects to develop high-temperature electronic packages. Such efforts have led to the development of high temperature power modules based on aluminum nitride (AlN) ceramic substrates. AlN ceramic has excellent high temperature stability, high thermal conductivity and a coefficient of thermal expansion (CTE) closely matching that of SiC and Si materials.

One approach is to use a molded AlN package with nickel (Ni) conductor traces actively brazed to the AlN substrate. Semiconductor chips are soldered directly to the Ni conductors and aluminum wirebonds connect the devices to interconnect circuitry on the AlN substrate. This approach is very similar to the conventional ceramic hybrid packaging technology. Another slightly different approach is to use a flat AlN substrate with patterned metal films, and a Kovar alloy case and Kovar feedthroughs brazed to the AlN substrate. Yet another approach was to use direct die attaching and flip-chip techniques in addition to the use of AlN substrates, as explained by in an article found on the Internet by T. O. Martin and T. R. Bloom, "High Temperature Aluminum Nitride Packaging," (http://www.ctscorp.com/techpapers/techpapers.html). This approach eliminates the need for wirebonds which are known to be the weakest link at high temperatures. However, this approach does not offer high current handling capability due to the high resistance of the thick-film Au or Pt interconnection layer used.

Problems still exists with the prior art described above. Many factors have to be considered in the preparation of satisfactory high-temperature electronic packaging, so the devices are often very complicated and costly. For example, some of the considerations, include, but are not limited to, characterizing materials and their interactions at high temperatures, minimizing mechanical stresses caused by thermal expansion mismatches, providing a suitable path for heat dissipation, providing environmental protection, facilitating system integration (from chip-level to board-level). In addition, high current capability and low package interconnect impedance are critical factors in the design of hybrid power modules for power electronic systems.

None of the prior art references is entirely without technical merits, those aluminum nitride (AlN)-based high temperature modules are essentially very costly duplicates of the existing conventional temperature hybrid module technology, which is, unfortunately, a 20-year old technology due for an overhaul itself. The biggest problem of a conventional power module is the complexity of its material system, which is comprised of multiple semiconductor chips, one or more ceramic substrates with patterned metal interconnect films, a metal baseplate, Al or Au wirebonds connecting the semiconductor chips to the substrate metal layer, soldering joints of semiconductor-to-substrate and substrate-to-baseplate, epoxy sidewall module case, external metal posts or feedthroughs, and silicon-gel potting material. Such a module construction method unnecessarily increases the module's weight, size, and junction-to-case thermal resistance.

More critically, the complex material system creates many joints and interfaces between dissimilar materials, which tend to cause reliability concerns at high temperatures or under thermal cycling conditions. For example, it is well known that aluminum wirebonds tend to fail by creep deformation at high temperatures, and tin/lead (Sn/Pb) solder joints suffer from voids or delineation under thermal cycling in the conventional power modules. While the reliability issue can be mitigated to a certain extent through the selection of new materials and processes (often with the penalty of a sharp increase in cost) as suggested by the aforementioned high temperature modules, it would be much more advantageous to have a simplified material system to begin with.

Furthermore, in the conventional hybrid power modules (and their high temperature variants alike), heat is solely dissipated from the semiconductor chips downward to the ceramic substrate, metal baseplate, and eventually to the external thermal management components such as the heat sinks or liquid-cooling cold plates. Note that the top side of the power module does not contribute at all to removing heat from the semiconductor chips. While this may be tolerated in the conventional temperature power converters equipped with sophisticated cooling subsystems, it is highly desirable to dissipate heat from both sides of the module in high temperature electronic systems, where we expect to employ very simple or no cooling design at all.

In short, the existing hybrid power module technology, limited by its material and construction complexity, does not provide a good platform for new high temperature module development. It is simply not enough just to substitute the materials in the conventional module architecture with newer and more costly high-temperature alternatives. More disruptive technological innovation in both module architecture and material selection is needed to provide smaller, lighter, cheaper, and more reliable modules for high temperature power electronics in both military and commercial applications.

SUMMARY OF THE INVENTION

It is a primary objective of the present invention to provide a cost-effective, ultra-compact, hybrid power module packaging technology that allows devices to operate at over 300° C.

A second objective of the present invention is to provide a cost-effective, ultra-compact, hybrid power module packaging technology with improved long-term reliability for conventional temperature silicon-based power semiconductor devices.

A third objective of the present invention is to leverage recent advances in materials used in silicon carbide (SiC) power semiconductors and other wide band-gap semiconductor materials.

A fourth objective of the present invention is to provide a method for assembling packaging for semiconductor chips that is easy to use, low-cost and suitable for an efficient batch-mode manufacturing process.

A fifth objective of the present invention is to provide a hybrid power module with a simplified material system.

A sixth objective of the present invention is to provide a hybrid power module with double-side cooling that eliminates a sophisticated cooling subsystem.

A preferred efficient method for preparing a cost-effective, ultra-compact hybrid power module packaging system includes selecting at lease one semiconductor chip with a first side and a second side, bonding a first metal leadframe to a first side of the semiconductor chip, bonding a second metal leadframe to a second side of the semiconductor chip, and encapsulating the semiconductor chip and bonded first and second metal lead frames with a high temperature polymer to provide a power module package with low parasitic resistance and high current-carrying capability.

The preferred method of preparing a power module package includes the use of semiconductor chips of silicon, silicon carbide and mixtures thereof and first and second metal leadframe fabricated from of molybdenum, copper (Cu) and copper alloys. It is more preferred that molybdenum is further plated with a layer of nickel (Ni) and a layer of gold (Au).

It is also preferred that the copper and copper alloy metal leadframes are bonded to the semiconductor chip by soldering or brazing, wherein the brazing step uses a gold-based eutectic braze alloy.

A preferred high temperature polymer for encapsulating is polyetherketone (PEK), PEK with glass, PEK with carbon filler, liquid crystal polymer (LCP, silicon/polyimide mixtures and thermoset microwave materials (TMM). Preferably, encapsulating is achieved by a process of injection molding.

The preferred overall thickness of the hybrid power module of the present invention is in a range from approximately 2 mm to approximately 7 mm.

A preferred cost-effective, ultra-compact hybrid power module packaging system includes at least one semiconductor chip having a first side and a second side, a first metal leadframe bonded to a first side of the semiconductor chip, a second metal leadframe bonded to a second side of the semiconductor chip, and a high-temperature polymer to encapsulate the first and second metal leadframes bonded to the semiconductor chip to provide a module package with low parasitic resistance and high current-carrying capacity.

The preferred hybrid power module includes a semiconductor chip made of silicon, silicon carbide and mixtures thereof with the first and second metal leadframe made of molybdenum, copper (Cu) and copper alloys. Preferably, the molybdenum metal leadframe is further plated with a layer of nickel (Ni) and a layer of gold (Au).

The preferred high temperature polymer for encapsulating the power module is polyetherketone (PEK), PEK with glass, PEK with carbon filler, liquid crystal polymer (LCP, silicon/polyimide mixtures and thermoset microwave materials (TMM). Encapsulating is achieved preferably by a process of injection molding.

It is preferred that the copper and copper alloy metal leadframes are bonded to the semiconductor chip by soldering, wherein the soldering step uses a tin/lead (Sn/Pb) solder paste or the copper and copper alloy metal leadframes are bonded to the semiconductor chip by brazing, wherein the brazing step uses a gold-based eutectic braze alloy.

The preferred hybrid power module has an overall thickness in a range from approximately 2 mm to approximately 7 mm, preferably in a range from approximately 3 mm to approximately 5 mm.

Further objects and advantages of this invention will be apparent from the following detailed description of the presently preferred embodiments, which are illustrated schematically in the accompanying drawings.

DESCRIPTION OF THE PREFERRED EMBODIMENTS

Before explaining the disclosed embodiments of the present invention in detail, it is to be understood that the invention is not limited in its application to the details of the particular arrangements shown since the invention is capable of further embodiments. Also, the terminology used herein is for the purpose of description and not of limitation.

According to the present invention, the objectives stated above are met by preparing a hybrid power module with a simple material system that is reliable in high temperature conditions with low cost and excellent manufacturability.

For purposes of illustrating the present invention, but not as a limitation, two embodiments will be described in detail below.

First Embodiment

Figure 2:
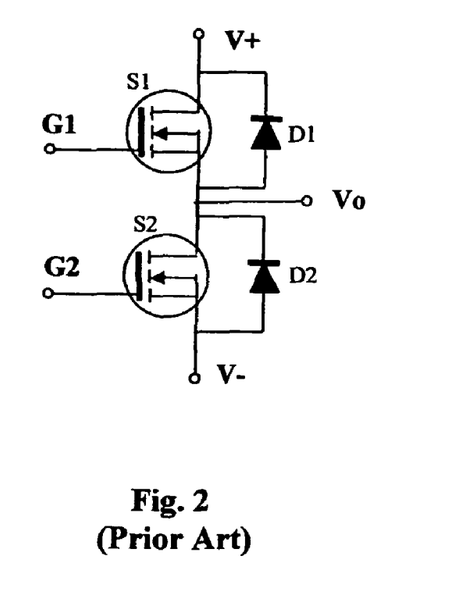
FIG. 2 is a SiC half-bridge circuit, consisting of two active SiC switches and two anti-parallel SiC Schottky diodes. (Prior Art)

A novel hybrid power module concept is disclosed based on the use of double metal leadframes, direct leadframe-to-chip bonding, and injection-molded high temperature polymer encapsulation. A half-bridge circuit, consisting of two active SiC switches and two anti-parallel SiC Schottky diodes, is used for the purpose of illustration and specification of the prototype module design. The half-bridge circuit commonly used in conventional power modules is shown in FIG. 2. In FIG. 2, S1 and S2 are SiC power MOSFETs while D1 and D2 are SiC Schottky diodes.

The power module in FIG. 2 is the most basic building block in power electronics, which can be used in various combinations in electric vehicle motor drive inverters, power supply DC/DC converters, uninterruptible power supply DC/AC inverters, and many other applications. Nevertheless, the module construction of the present invention can be easily adapted to other circuit configuration such as 3-phase inverters or even RF power circuits.

Figure 3A:
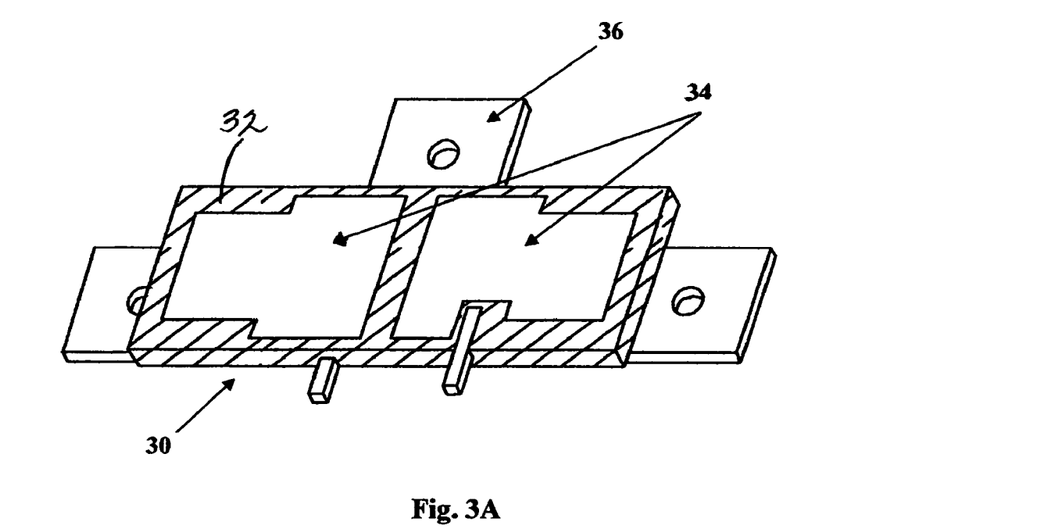
FIG. 3A is a fully assembled hybrid power module of the present invention using double metal leadframes
Figure 3B:
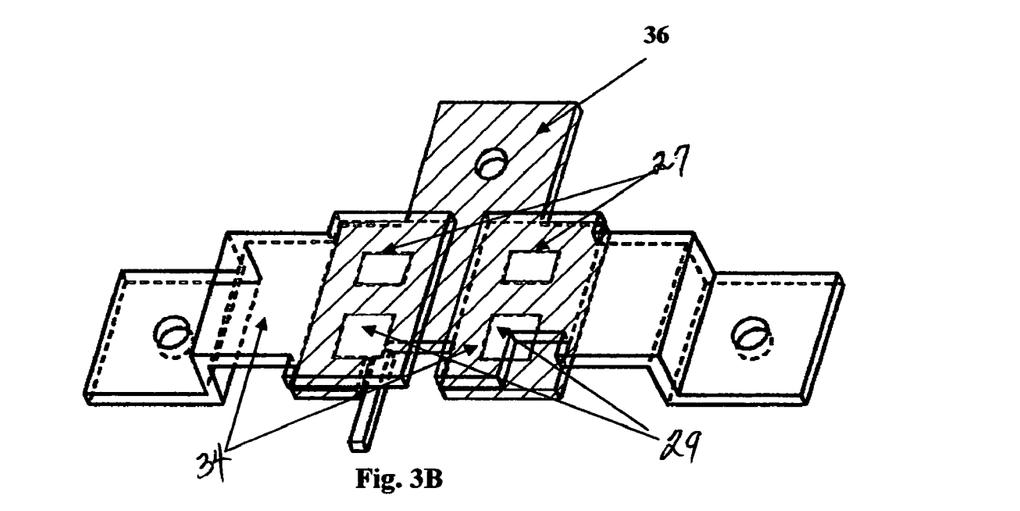
FIG. 3B is a semi-transparent view of the novel SiC half-bridge power module shown in FIG. 3A, showing the bottom metal leadframe.

The new module 30 of the present invention is illustrated in FIGS. 3A and 3B. In FIG. 3A, two metal leadframes 34, 36 are made, preferably from molybdenum (Mo) sheet metal using a metal stamping process. This is very similar to how Cu leadframes are made for common plastic semiconductor packages such as TO-220 or TO-247. Molybdenum provides excellent high temperature stability, adequate electrical and thermal conductivity, low cost, and a coefficient of thermal expansion (CTE) closely matching that of SiC and Si materials. The Mo leadframe 34 is on a top surface and Mo leadframe 36 is on a bottom surface; the Mo leadframes will serve as both the external leads and the internal interconnect to the semiconductor chips enclosed in the power module. Also shown in FIG. 3A is the polymer encapsulation 32 that surrounds the metal leadframes. The Mo leadframes 34, 36 are plated with a thin nickel (Ni) metal layer and a thick gold (Au) layer to accommodate direct Au—Au bonding with SiC chips 27, 29 (shown in FIG. 3B) and enhance high-temperature stability.

FIG. 3B is a semi-transparent view of the power module showing the position of the bottom Mo leadframe 36 and the placement of two sets of SiC chips 27 and 29.

SiC devices with Ni as contact metal and thick Au film as cap metallization demonstrated stable operation at high temperatures as reported in *High Temperature Electronics*, edited by R. Kirschman, IEEE Press, 1999, page 516. In the module design of the present invention, a 3-4 μm Au film will be formed on both the front and back sides of the two-sets of SiC chips 27, 29 to accommodate direct Au—Au bonding with the Au-plated Mo leadframes. Each set of SiC chips contains two chips for a total of four SiC chips.

The SiC chips 27, 29 are sandwiched between and bonded to the top 34 and bottom 36 leadframes using a thermocompression bonding process. Au—Au bonding system is capable of reliable performance at 300° C. or higher temperature. The thermocompression bonding temperature essentially depends on the eutectic temperature of the Au-based alloy brazes or hard solders to be used. For example, Au/Si and Au/In alloys exhibit a eutectic melting temperature of 363° C. and 451° C. respectively. The Au-based alloy "hard" solders or brazes have high strength, low elasticity, but low fatigue resistance and little stress relief. Fortunately, this does not present a major challenge in module construction of the present invention, since the Mo leadframes 34, 36 have a CTE (5 ppm/° C.) very close to that of SiC (3.8 ppm/° C.) and the Mo/SiC/Mo sandwich structure should only experience a minimum amount of theromechanical stress even at high temperatures.

Figure 4:
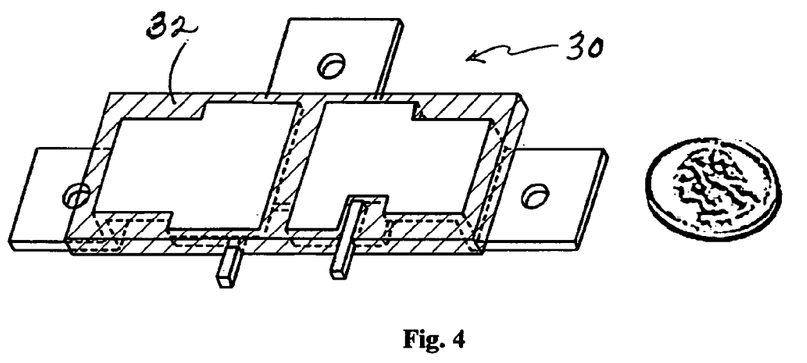
FIG. 4 is a perspective view of the hybrid power module of the present invention comparing the physical dimensions of the module with a coin that is approximately 25 mm in diameter.

For multi-chip module manufacturing, a thin ceramic insert plate with patterned open windows slightly larger than the SiC chips may be used to hold all SiC chips in place and ensure good alignment between the Mo interconnect fingers and bond pads on the SiC chips during the thermocompression bonding process. The bonded Mo/SiC/Mo sandwich structure at this point is mechanically strong and ready to proceed to an injection molding process. FIG. 4 is shows the polymer encapsulation 32 of the power module and a comparison of the size of the hybrid power module of the present invention in relation to a coin that is approximately 25 mm in diameter.

Injection-molded plastics can be used to form electronic package encapsulation with an extremely low cost and high manufacturability. Advances in high temperature and hermetic polymer materials provide great potential of using the same injection molding technique to form the encapsulation of our proposed hybrid power module. High temperature polymer materials that are considered for this purpose may include, but are not limited to, the liquid crystal polymer (LCP) from Quantum Leap Packaging Inc., Wilmington, Mass., LaRC-RP46 from NASA, thermoset microwave materials (TMM), and polyetherketone (PEK) with glass or fiber fillers that are also commercially available.

Leadframes serve as the external power and control leads as well as the internal metal fingers connected to the drain, source and gate electrodes of the SiC power MOSFET or the anode and cathode of the SiC Schottky diode. They must provide mechanical support, electrical conduction paths, and thermal conduction paths. Thus, important properties of the base metal materials are electrical conductivity, thermal conductivity, strength, and the coefficient of thermal expansion (CTE). While nearly all usable metals have a melting temperature well in excess of 400° C., the main concerns for high-temperature failure are oxidation, corrosion, thermomechanical stress and fatigue. The commonly used Cu alloys such as C-151 or C-155 in conventional temperature plastic packages have excellent electrical and thermal conductivity but a CTE 4-5 times higher than that of SiC, therefore are not suitable for high temperature applications. Degradation in strength of these Cu alloys due to high temperature annealing is yet another concern. Kovar or iron-nickel Alloy 42 has a CTE close to that of SiC, but suffers from low electrical and thermal conductivity. Noble metals such as Au and Pt are high temperature resistant, but cost prohibitive. Their use should be limited to the thin electro-plated films coated on other base metals.

Molybdenum (Mo) has an electrical resistivity of 5.2 μΩ-cm, slightly higher than Au (2.2 μΩ-cm) or Cu (1.7 μΩ-cm) but much lower than Kovar (49 μΩ-cm) or Alloy 42 (70 μΩ-cm). The thickness of Mo leadframes is determined by manufacturability of Mo sheet metal stamping process. We expect to adapt a typical thickness of 1-3 mm, roughly 2-25 times thicker than the direct bond or actively brazed Cu or Ni metallization on $Al_2O_3$ or AlN substrates (typically 200-500

μm), and 40-120 times thicker than co-fired Au or Pt thick-film metal layers in LTCC substrates (typically less than 25 μm). The Mo leadframes are also far more conductive than the 10-15 mil (in diameter) Al or 2-5 mil Au wirebonds commonly used in the prior-art power modules. As a result, the Mo leadframes provide low parasitic resistance and high current-carrying capability.

Figure 5A:
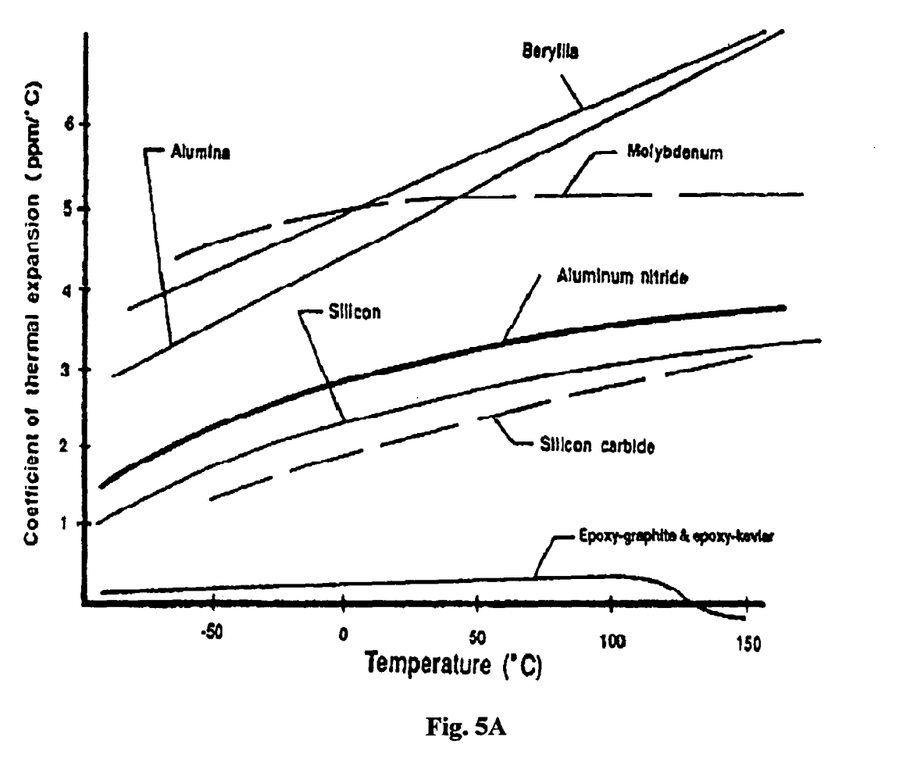
FIG. 5A is a graph of the coefficients of thermal expansion for materials used in the power module of the present invention.
Figure 5B:
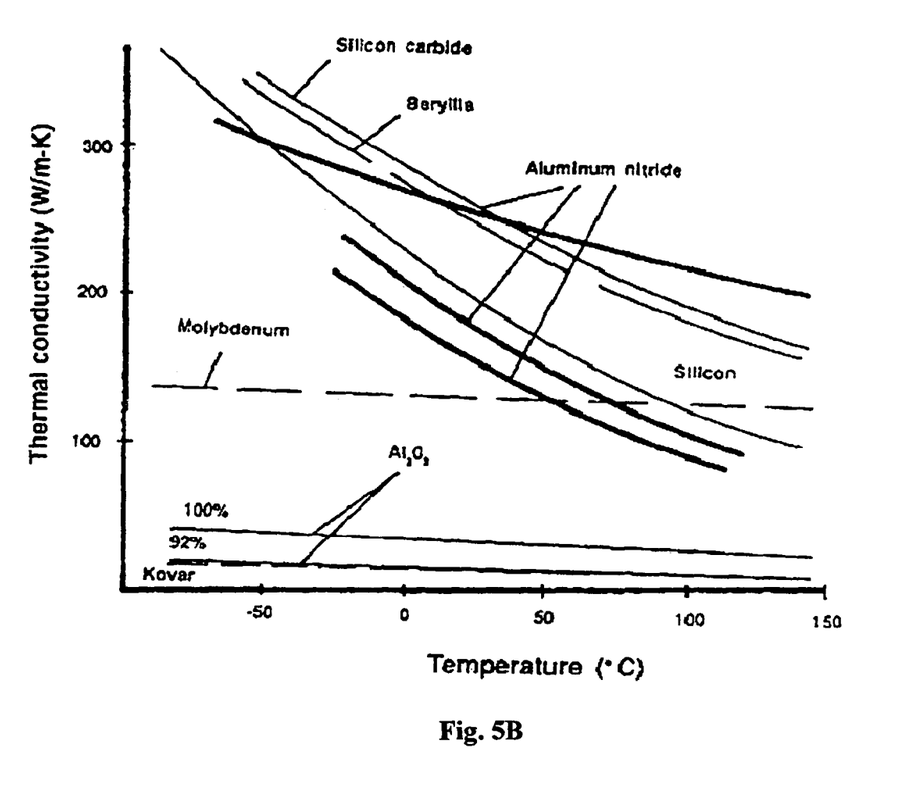
FIG. 5B is a graph of the thermal conductivities of packaging materials used in the present invention as a function of temperature.

FIGS. 5A and 5B show the coefficients of thermal expansion (CTE) and thermal conductivities, respectively, of Mo, SiC, Si, and several ceramic materials over a temperature range. FIG. 5A clearly shows that Mo has a CTE and thermal conductivity nearly independent of temperature. The CTE of Mo is reasonably close to that of SiC at room temperature and becomes even more closely matched at higher temperatures due to the positive temperature dependence of SiC's b. FIG. 5B shows the thermal conductivity of Mo is comparable to that of Si at room temperature and does not degrade with increasing temperature. The Mo leadframes are electroplated with Au film to enhance oxidation resistance at high temperatures and accommodate direct Au—Au bonding to the SiC chips which are Au metallized on both top and bottom surfaces.

Gold (Au) eutectic metallurgical leadframe-to-chip bonding is highly preferred for high power applications, because of its superior electrical and thermal conductivity. Au—Au bonds are free of harmful intermetallic formation at interfaces and were tested for 1000 hours at 500° C. with no electrical or mechanical degradation. Hard solders such as Au eutectic alloys are preferred in high temperature packages since they have the higher moduli and higher flow stresses needed to provide fatigue and creep resistance at elevated temperatures. However, they also transfer more stress to the semiconductor chip, often causing chip fracture. It is therefore critical to select a leadframe metal which has a CTE closely matching that of the SiC chip. The problem can be mitigated with our selection of Au-plated Mo as the leadframe material. Fortunately, Mo leadframes have a CTE (5 ppm/° C.) very close to that of SiC (3.8 ppm/° C.) and the Mo/SiC/Mo sandwich structure should only experience a minimum amount of theromechanical stress even at high temperatures. Table 1 lists several Au-based high-temperature solder/braze alloys. The thermocompression bonding temperature essentially depends on the melting temperature of the Au-based alloy brazes or hard solders to be used. For example, Au/Si and Au/In alloys exhibit a eutectic melting temperature of 363° C. and 451° C. respectively. In this subtask, we will evaluate and compare material properties (i.e. bonding strength, mechanical stress, intermetallics formation) and processing compatibility of the candidate solder materials and make the final selection.

TABLE 1

Melting temperatures of Au-based solder and braze alloys

| Composition (wt. %) | Solidus (° C.) | Eutectic (° C.) | Liquidus (° C.) |
|---|---|---|---|
| 80 Au/20 Sn | | 280 | |
| 88 Au/12 Ge | | 356 | |
| 96.76 Au/3.24 Si | | 363 | |
| 82 Au/18 In | 451 | | 485 |
| 82 Au/18 Ni | | 950 | |

Today's plastic packages, both molded types and simply coated (glob top) encapsulations, are generally not suitable for operating temperature above 150° C. For example, the glass transition temperature of commonly used packaging epoxies is in the range of 130-170° C., which limits the operating temperature range of the package. Plastic packages also subject wire bonds to extreme stresses if the package undergoes large temperature swings. Most of the common plastic packages will fail quickly above 200° C. Standard solid epoxy injection-molded encapsulation materials are based on Novolac chemistry, at temperatures above 250° C. in air, weight loss occurs at a rate of about 0.01% per hour. After sustained operation at high temperature, the resulting microporosity makes the component much more susceptible to moisture uptake. If the application entails exposure to moisture and temperature cycling, the increased porosity may lead to shorter lifetimes.

Despite these obstacles, the continued use of plastic packaging in the high temperature ranges is highly desirable. There are many technical and market reasons for expecting organic packaging to meet the high temperature needs. Injection-molded plastics can be used to form electronic package encapsulation with an extremely low cost and high manufacturability. The last decade has seen the development of new organic encapsulation materials that can sustain high temperatures. Advances in high temperature and hermetic polymer materials provide great potential of using the same injection molding technique to form the encapsulation of our proposed hybrid power module. For example, polyetherketon (PEK), also under the trade names of Hostatec, Kadel, Stilan, Ultrapek, and Victrex, typically has a maximum operation temperature of 367° C. and provides high temperature resistance with good chemical resistance and low flammability. Used with glass or carbon filler, PEK is a good thermoplastic candidate for encapsulating our proposed power module. Another example is the new Liquid Crystal Polymer (LCP) developed by Quantum Leap Packaging, Inc. (Wilmington, Mass.) as an encapsulation material to compete with the more costly and traditional ceramic and metal component packaging. A key feature of Quantum Leap's LCP material is that it supports up to 400° C. applications while still offering MIL-SPEC hermetic properties.

Furthermore, new silicon/polyimide mixtures have been developed that survive long operational times above 400° C. and enhance package hermeticity. Other candidate high temperature polymer materials may include, but are not limited to, LaRC-RP46 from NASA, and thermoset microwave materials (TMM).

Second Embodiment

Figure 6A:
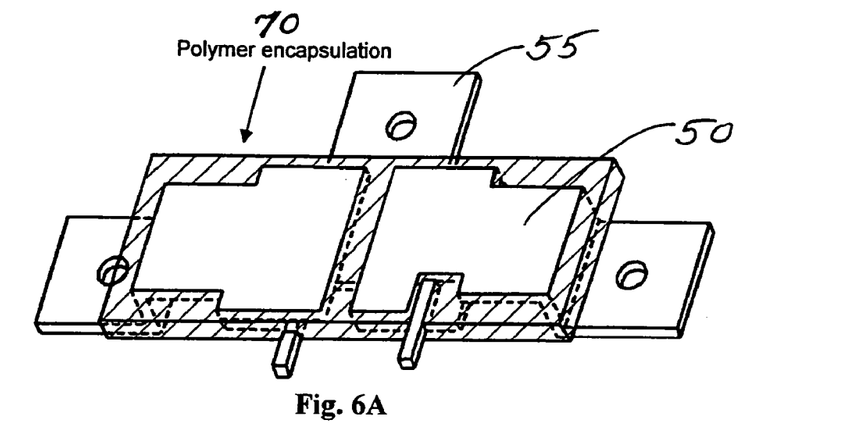
FIG. 6A is a perspective view of the half-bridge SiC power module of the present invention showing polymer encapsulation of the module.
Figure 6B:
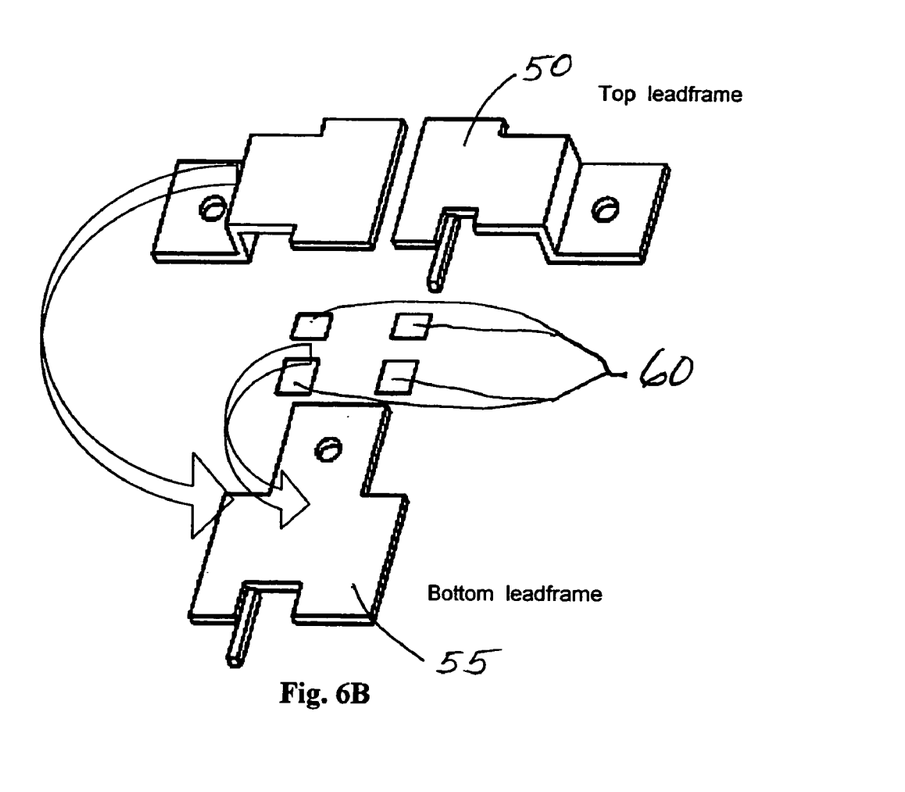
FIG. 6B is an exploded view of the half-bridge SiC power module of the present invention showing the assembly process.

This embodiment is intended for medium or conventional temperature applications. The basic module structure remains the same as shown in FIGS. 6A and 6B. However, the leadframes can be made of copper (Cu) or Cu alloys instead of Mo. Silicon (Si) or silicon carbide (SiC) semiconductor chips 60 can be soldered to the leadframes using conventional soft solders such as tin/lead (Sn/Pb) solder paste. Conventional plastic encapsulation materials can be used as the molding compound to form the module encapsulation 70. When compared to the prior art conventional temperature power module, the new module still maintains most of the advantages described herein.

Figure 7A:
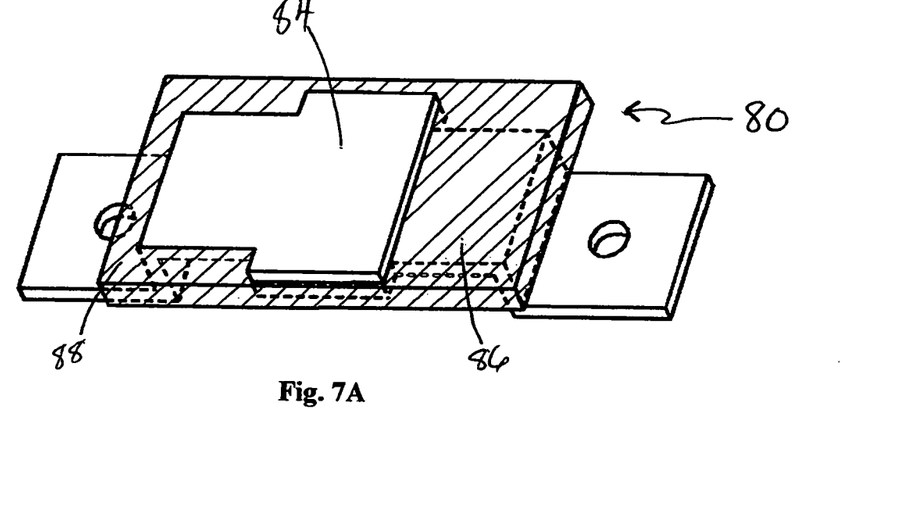
FIG. 7A is a perspective view of the polymer encapsulated single-chip diode power module of the present invention.
Figure 7B:
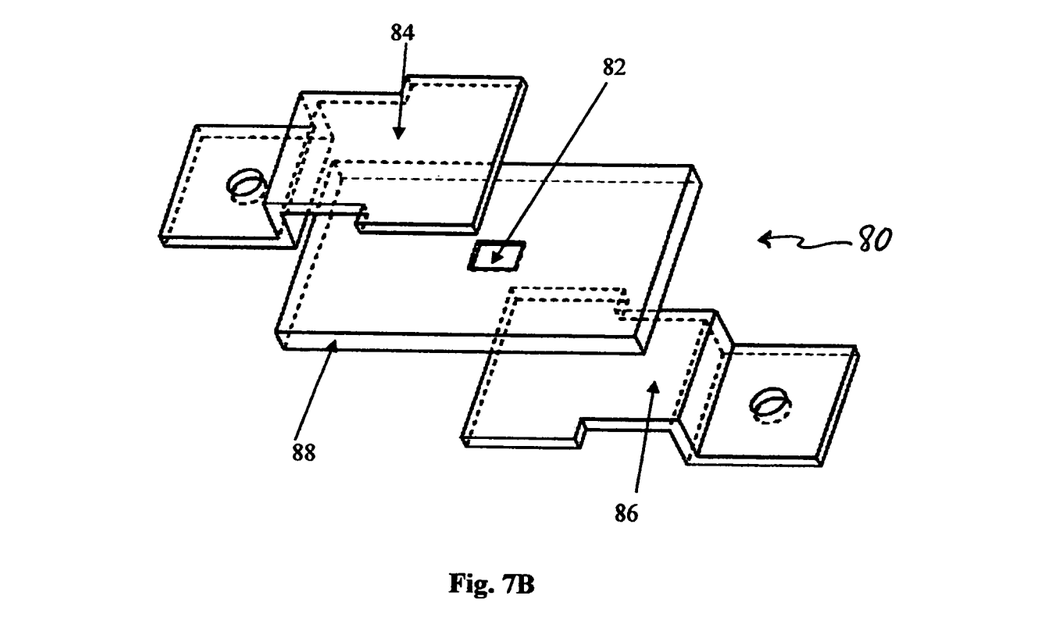
FIG. 7B is an exploded view of a single-chip diode power module of the present invention showing the assembly process.

FIG. 7A provides a smaller configuration 80 of the hybrid power module of the present invention wherein a single SiC chip is used. FIG. 7B is an exploded view of the single chip diode power module 80 with a sandwich arrangement of a top metal leadframe 84 and a bottom metal leadframe 86 with the SiC chip 82 between the two leadframes 84, 86. The entire module is encapsulated 88 with a polymeric material as previously described herein.

The present invention provides a new hybrid power module having the following unique technical merits in comparison to the prior art high temperature packaging solutions.

A major advantage of the hybrid power module of the present invention is that it uses a simple material system and provides improved reliability. The new module essentially has only three basic elements: the Mo leadframes, SiC chips, and polymer encapsulation, resulting in a much simpler material system than the prior-art hybrid power modules. The new module is completely free of unreliable wirebonds and soft solder joints. The nearly ideal direct Au—Au bonding between the CTE-matched SiC chips and Mo leadframes, when combined with the carefully selected low-stress, high-temperature, hermetic polymer encapsulation material, should provide much improved long-term reliability for high temperature applications.

Another advantage is the module's high current and high power capability. The Mo leadframes serve both as the external leads and the internal interconnect to the SiC chips enclosed in the power module. Molybdenum has an electrical resistivity of 5.2 μΩ-cm, slightly higher than Au (2.2 μΩ-cm) or Cu (1.7 μΩ-cm) but much lower than Kovar (49 μΩ-cm) or Alloy 42 (70 μΩ-cm). The Mo leadframes can be designed to have a thickness of 1-3 mm, roughly 2-25 times thicker than the direct bond or actively brazed Cu or Ni metallization on $Al_2O_3$ or AlN substrates (typically of 200-500 μm), and 40-120 times thicker than the co-fired Au or Pt metal films in LTCC substrates (typically less than 25 μm). The Mo leadframes are also far more conductive than the 10-15 mil (in diameter) Al or 2-5 mil Au wirebonds commonly used in the prior-art power modules. As a result, the Mo leadframes provide low parasitic resistance and high current-carrying capability. We expect the new power module concept to offer a current rating up to several thousands of amperes.

The hybrid power module of the present invention reduces package parasitic impedances. Eliminating Al or Au wirebonds in the new module will lead to a substantial reduction in both parasitic resistances and inductances, which usually cause voltage overshoots and excessive power losses in the operation of power modules.

Another important advantage of the power module of the present invention is double-side cooling. The exposed parts of the Mo leadframes also serve as heat spreaders or heat sinks in addition to their role of electrical leads, similar to the metal tab (the drain lead of a power MOSFET) of a conventional plastic package such as TO-220 or TO-247. Heat can be effectively removed from both sides of the SiC chips and transferred to the Mo leadframes and eventually to the ambient environment, resulting in lower operating junction temperatures. Double-side heat removal, when applied to wide band-gap semiconductors, can help completely eliminate the need of cooling subsystems and lead to substantial cost saving at the system level.

Another advantage of the present invention is the ultra-thin form factor. The new module will have a thickness of between approximately 2 and approximately 7 millimeters (mm), preferably between approximately 3-5 mm, which is roughly 5 times thinner than the prior-art power modules. The footprint area of the new module can also be substantially reduced due to the simplified metal interconnect scheme used. We also expect a minimum 10× reduction in module weight since no heavy metal baseplate or tall expoxy case is needed. As discussed earlier, FIG. 4 shows the physical dimensions of a 1200V/200 A SiC half-bridge module design based on the new concept.

An additional advantage of the hybrid power module of the present invention is the low cost and excellent manufacturability. The new power module can be manufactured using the low-cost leadframe-die assembly and plastic injection molding processes well established by the electronics industry. Existing tooling and assembly equipment can be easily adapted for new power module production. The cost of Molybdenum is very modest and the process of stamping Mo metal sheet into leadframes should be straightforward and low cost. Tens or even hundreds of the new power modules can be formed on a single Mo metal sheet, allowing an extremely efficient and low cost batch-mode manufacturing process.

Yet, another advantage of the hybrid power module of the present invention is its modular design and ease of system integration. The new modules can be used alone or in various combinations to meet the requirement of power electronic systems of different topologies or power ratings. The high-temperature requirement for some electronic systems is mainly imposed by the operation environment such as aircraft or automobile engine compartments. In these applications, every component and the electronic system as a whole must be high-temperature capable. However, the high-temperature requirement for most if not all power electronic systems are imposed mainly by their internal power losses and self-heating rather than the outside environment. In these systems, it is often more practical and cost effective to separate the heat-generating "power core" from the low-power electronics such as sensors, analog and digital control circuits, resulting in a "mixed-temperature" design. The new power modules can be easily assembled into the "high temperature quarters" by being bolted to laminated metal power buses in these mixed-temperature power electronic systems.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. A cost-effective, ultra-compact hybrid power module packaging system consisting of:
    one single two terminal power semiconductor chip having a top side and a bottom side with a layer of bonding material formed on each of the top and bottom sides;
    a first molybdenum leadframe having a first end bonded to the top side of the power semiconductor chip as a first internal interconnect to one terminal of the one single power semiconductor chip;
    a second molybdenum leadframe having a first end bonded to the bottom side of the one single power semiconductor chip as a second internal interconnect to an opposite terminal of the one single power semiconductor chip with the first end of each of the first and second molybdenum leadframes overlapping to form a sandwiched structure; and
    a high-temperature polymer between the overlapping ends of the first and second molybdenum leadframes to encapsulate the one single power semiconductor chip bonded to the one single power semiconductor chip leaving the outer surface of the first and second molybdenum leadframes exposed for double-side cooling, the opposite ends of the first and second leadframes extending in opposite directions from the one single semiconductor chip exposed as external leads to provide a module package with low parasitic resistance and high current-carrying capacity, wherein the high temperature polymer for encapsulating is selected from the group consisting of polyetherketone (PEK), PEK with glass, PEK with carbon filler, liquid crystal polymer (LCP), silicon/polyimide mixtures and thermoset microwave materials (TMM).

2. The hybrid power module packaging system of claim 1 wherein the power semiconductor chip is selected from the group consisting of silicon, silicon carbide and mixtures thereof.

3. The hybrid power module packaging system of claim 1, wherein each of the molybdenum leadframes are plated with nickel and further plated with a layer of gold (Au).

4. The hybrid power module packaging system of claim 1, wherein the encapsulate includes an injection molded encapsulate.

5. The hybrid power module packaging system of claim 1, wherein the overall thickness of the hybrid power module system is in a range from approximately 2 mm to approximately 7 mm.

6. The hybrid power module packaging system of claim 1, wherein the overall thickness of the hybrid power module system is in a range from approximately 3 mm to approximately 5 mm.

7. A cost-effective, ultra-compact hybrid power module packaging system consisting of:
   one single two terminal power semiconductor chip having a top side and a bottom side with a layer of bonding material formed on each of the top and bottom sides, wherein the power semiconductor chip is selected from the group consisting of silicon, silicon carbide and mixtures thereof;
   a first molybdenum leadframe bonded to the top side of the power semiconductor chip as a first internal interconnect to one terminal of the one single power semiconductor chip;
   a second molybdenum leadframe bonded to the bottom side of the one single power semiconductor chip as a second internal interconnect to an opposite terminal of the one single power semiconductor chip with one end of each of the first and second molybdenum leadframes overlapping to form a sandwiched structure; and
   a high-temperature polymer between the first and second molybdenum leadframes to encapsulate the one single power semiconductor chip between the overlapping ends of the first and second leadframes bonded to the one single power semiconductor chip leaving the outer surface of the first and second molybdenum leadframes exposed for double-side cooling, the other ends of the first and second leadframes extending in opposite directions from the one single semiconductor chip exposed as external leads to provide a module package with low parasitic resistance and high current-carrying capacity, wherein the high temperature polymer for encapsulating is selected from the group consisting of polyetherketone (PEK), PEK with glass, PEK with carbon filler, liquid crystal polymer (LCP), silicon/polyimide mixtures and thermoset microwave materials (TMM), wherein the overall thickness of the hybrid power module system is in a range from approximately 2 mm to approximately 7 mm.

8. The hybrid power module system of claim 7, wherein each of the molybdenum leadframes are plated with nickel and further plated with a layer of gold (Au).

9. The hybrid power module system of claim 7, wherein the overall thickness of the hybrid power module system is in a range from approximately 3 mm to approximately 5 mm.

10. The hybrid power module system of claim 7, wherein the encapsulate includes: an injection molded encapsulate.

* * * * *